United States Patent [19]

Dery et al.

[11] Patent Number: 4,729,809
[45] Date of Patent: Mar. 8, 1988

[54] ANISOTROPICALLY CONDUCTIVE ADHESIVE COMPOSITION

[75] Inventors: Ronald A. Dery; Warren C. Jones, both of Winston-Salem, N.C.; William J. Lynn, Groveland, Mass.; John R. Rowlette, Clemmons, N.C.

[73] Assignee: AMP Incorporated, Harrisburg, Pa.

[21] Appl. No.: 16,496

[22] Filed: Feb. 17, 1987

Related U.S. Application Data

[63] Continuation of Ser. No. 710,361, Mar. 14, 1985, abandoned, which is a continuation-in-part of Ser. No. 601,836, Apr. 19, 1984, abandoned.

[51] Int. Cl.⁴ .................. B29C 65/02; B29C 65/54; B32B 5/16; B32B 7/12
[52] U.S. Cl. .................. 156/306.6; 156/298; 156/300; 156/276; 174/68.5; 174/88 R; 174/94 R; 174/98; 200/265; 252/511; 252/512; 252/513; 252/514; 252/518; 338/13; 338/47; 338/72; 338/99; 338/114; 338/220; 339/17 R; 339/17 A; 339/17 M; 339/18 C; 339/59 M; 339/61 M; 339/DIG. 3; 357/65; 357/80; 428/323; 428/328; 428/901
[58] Field of Search .......... 156/276, 298, 300, 306.6; 174/68.5, 88 R, 94 R, 98; 200/265; 252/511, 512, 513, 514, 518; 338/13, 47, 72, 99, 114; 339/17 R, 17 A, 17 M, 18 C, 59 M, 61 M, DIG. 3; 428/323, 328, 901

[56] References Cited

U.S. PATENT DOCUMENTS

| | | | |
|---|---|---|---|
| 3,680,037 | 7/1972 | Nellis et al. | 339/DIG. 3 |
| 4,050,756 | 9/1977 | Moore et al. | 428/367 |
| 4,098,945 | 7/1978 | Oehmke | 252/514 |
| 4,113,981 | 9/1978 | Fujita et al. . | |
| 4,145,317 | 3/1979 | Sado et al. | 252/511 |
| 4,157,932 | 6/1979 | Hirota | 252/514 |
| 4,170,677 | 10/1979 | Hutcheson . | |
| 4,199,637 | 4/1980 | Sado . | |
| 4,201,435 | 5/1980 | Nakamura et al. | 428/372 |
| 4,209,481 | 6/1980 | Kashiro . | |
| 4,228,194 | 10/1980 | Meeder | 428/303 |
| 4,252,391 | 2/1981 | Sado . | |
| 4,288,081 | 9/1981 | Sado | 174/35 GC |
| 4,408,814 | 10/1983 | Takashi et al. | 428/85 |
| 4,423,435 | 12/1983 | Test . | |
| 4,449,774 | 5/1984 | Takashi et al. | 428/91 |
| 4,451,694 | 5/1984 | Harper et al. . | |
| 4,548,362 | 10/1985 | Hartman . | |

FOREIGN PATENT DOCUMENTS 0140619  8/1985  European Pat. Off. .
2152060  7/1985  United Kingdom .

Primary Examiner—James C. Cannon
Attorney, Agent, or Firm—Katherine A. Nelson

[57] ABSTRACT

An anisotropically conductive adhesive composition (10) for use in electrically connecting at least one conductive area (14) on one substrate (12) with at least one conductive area (20) on a second substrate (18) is disclosed. The composition (10) is comprised of a mixture of conductive particles and a nonconductive adhesive binder (26). The conductive particles are dispersed throughout the binder in a plurality of noncontiguous conductive units (24) such that, upon applying a layer (30) of the composition (10) over both the conductive and insulating areas (14, 16) on one substrate (12) and positioning in a conducting relationship and adhering said at least one conductive area (20) on the second substrate (18) with said at least one conductive area (14) on the first substrate (12), the units (24) establish electrical connection between the adhered conductive areas (14, 20) on the two substrates (12, 18). The units (24) are sufficiently spaced apart, however, to preclude electrical conductivity between adjacent areas on the same substrate. A method for electrically connecting conductive areas on two substrates by means of said anisotropically conductive adhesive composition (10) and products produced by said method are also disclosed.

22 Claims, 12 Drawing Figures

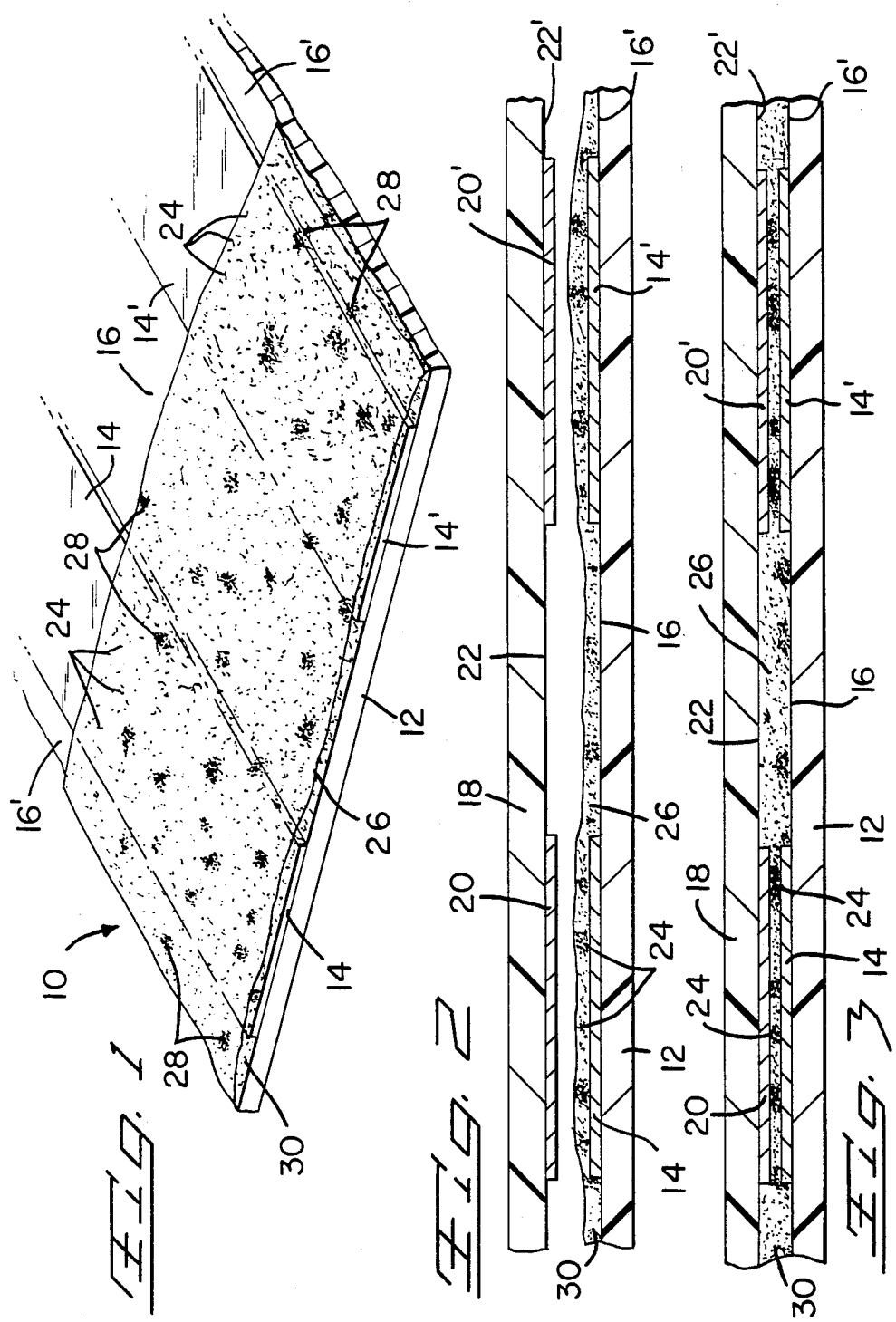

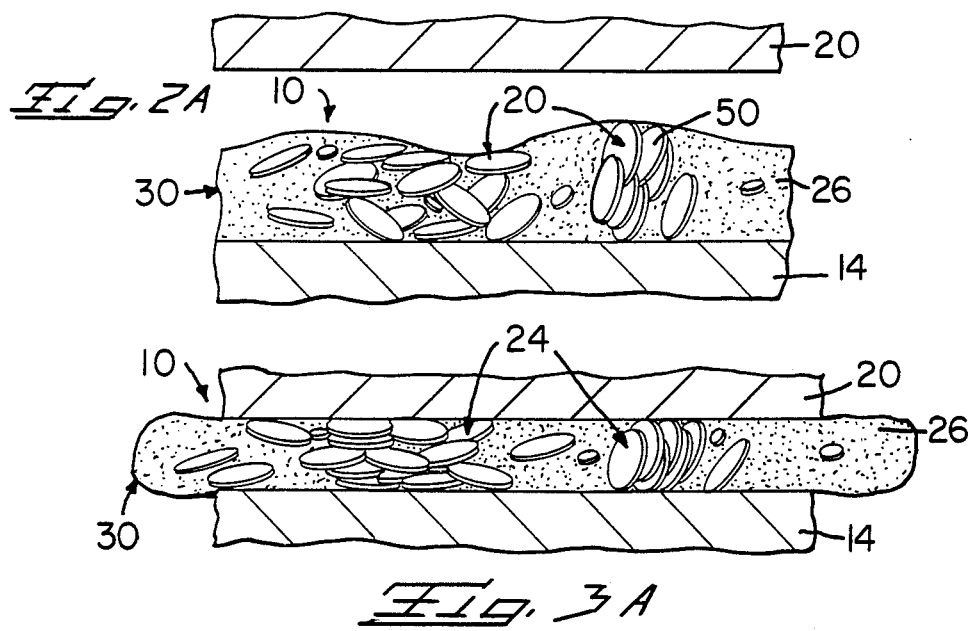
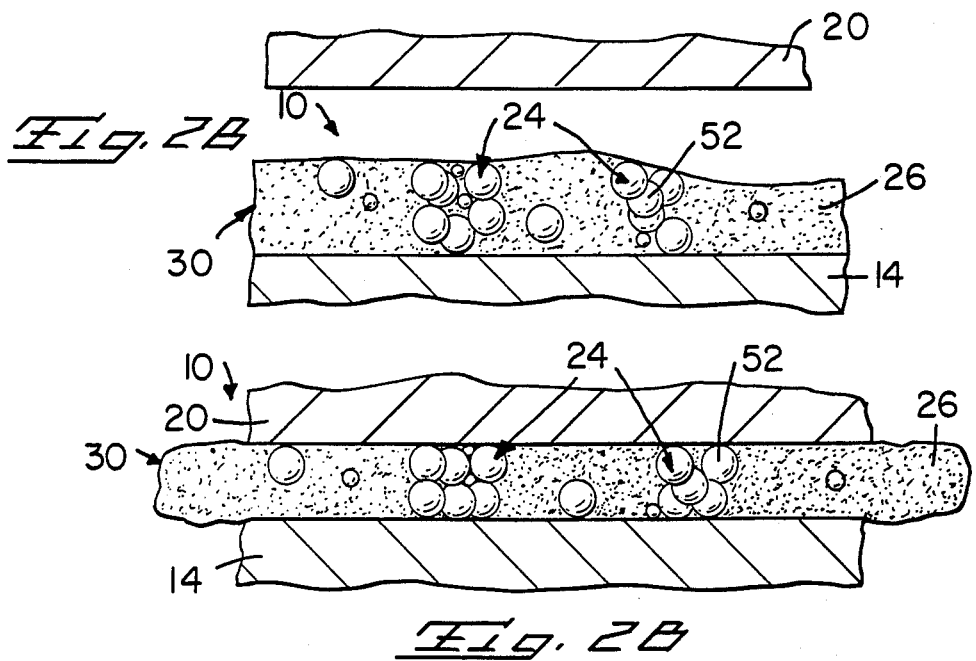

LAP JOINT RESISTANCE MEASUREMENT
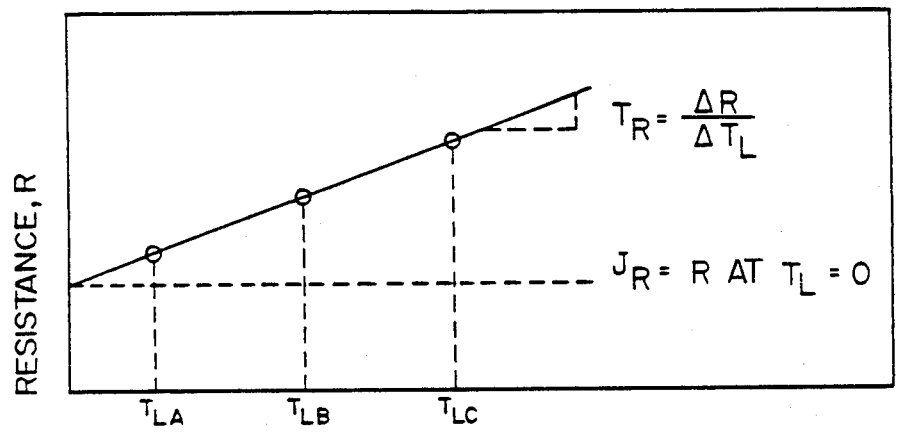
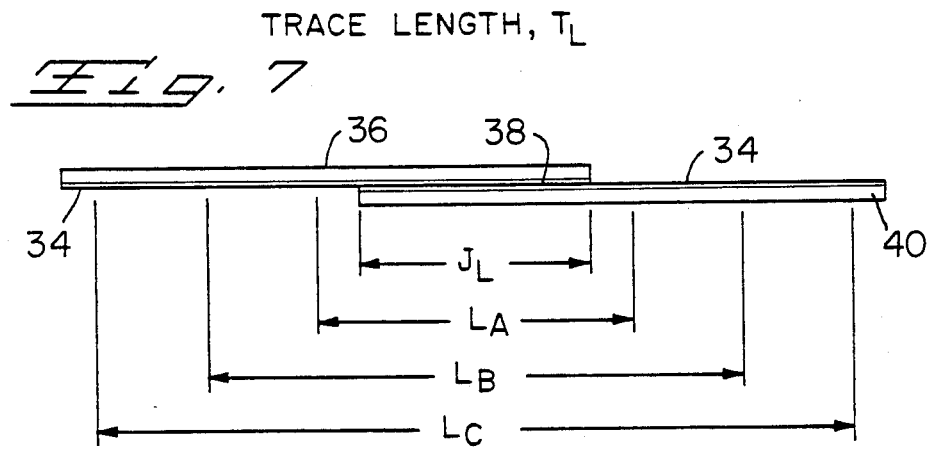
TRACE LENGTH = $T_L = L - J_L$
$R = J_R + T_R \times T_L$
JOINT RESISTANCE $J_R = R$ AT $T_L = 0$
TRACE RESISTANCE/UNIT LENGTH = $T_R = \dfrac{\Delta R}{\Delta T_L}$
Fig. 8

ANISOTROPICALLY CONDUCTIVE ADHESIVE COMPOSITION

This application is a continuation of application Ser. No. 701,361 filed 3/14/85, now abandoned; which is a continuation-in-part of U.S. patent application Ser. No. 601,836 filed Apr. 19, 1984, now abandoned.

FIELD OF THE INVENTION

This invention relates to conductive adhesive compositions and more particularly to an adhesive composition which is anisotropically conductive.

BACKGROUND OF THE INVENTION

There is an increasing need for reliable, efficient and economical means for interconnecting conductive areas on two substrates. The anisotropically conductive adhesive disclosed herein provides one such means.

The use of conductive adhesive is well known. The problem with most conductive adhesive is that they conduct equally well in all directions. They, therefore, must be applied only to those areas where electrical conduction is desired.

An anisotropically conductive adhesive, on the other hand, is an adhesive composition which will permit electrical conductivity normal to the plane of the substrate to which the adhesive has been applied, while precluding conductivity between adjacent conductive areas in the plane of the substrate.

U.S. Pat. No. 4,170,677 discloses one such anisotropically conductive adhesive composition. This disclosure reveals the use of whisker-like particles which are either paramagnetic or ferromagnetic. Once the adhesive is coated on a substrate, the substrate must be exposed to a magnetic or electrical field to make the conductive whiskers align perpendicular to the substrate. The adhesive must then be hardened while the field is still applied.

U.S. Pat. No. 4,252,391 discloses a method for preparing anisotropically pressure-sensitive electroconductive composite sheets. These sheets are comprised of electrically conductive fibers that have been distributed in a matrix of an electrically insulating substance. The fibers are aligned in a direction substantially perpendicular to the plane of the sheet.

The anisotropically conductive adhesive as disclosed in the present invention eliminates the necessity for using an externally applied force for orienting or alining any particles. Furthermore, the adhesive can be applied across the whole surface of the substrate. There is no need to apply the adhesive only to the conductive areas, nor to provide separate insulating means to preclude conductivity between adjacent areas in the same substrate.

An anisotropically conductive adhesive composition for use in electrically connecting at least one conductive area on one substrate with at least one conductive area on a second substrate, is disclosed herein. The adhesive composition is comprised of a nonhomogenous mixture of conductive particles in a nonconductive adhesive binder. The conductive particles, not requiring a specific shape, are dispersed randomly throughout the mixture in noncontiguous conductive units, each unit being comprised of individual particles. The units are sufficiently spaced apart to preclude electrical conductivity between adjacent conductive areas on the same substrate. Whereby, upon applying a layer of the adhesive composition over the conductive and insulating areas on the first substrate and positioning in a conducting relationship and adhering said at least one conductive area on the second substrate with said at least one area on the first substrate, the units establish electrical connection between the adhered conductive areas on the two substrates.

A method for electrically connecting at least one conductive area on one substrate with at least one conductive area on a second substrate is also disclosed. The method is comprised of the steps of: applying a layer of the herein disclosed anisotropically conductive composition over the conductive and insulating areas on a first substrate; positioning in a conducting relationship said at least one conductive area on the first substrate with said at least one conductive area on the second substrate; adhering said at least one conductive area on the first substrate with said at least one conductive area on the second substrate, whereby the noncontiguous conductive units establish electrical connection between the adhered conductive areas on the two substrates.

A product comprised of at least two substrates, each substrate having at least one conductive area and at least one insulating area on at least one surface thereof, said at least one conductive area on a first substrate being electrically connected to a corresponding conductive area on a second substrate is also disclosed. The electrical connection is accomplished by the method as taught herein.

The use of the anisotropically conductive adhesive composition can be understood by referring to the following drawings.

FIG. 1 is an enlarged fragmentary perspective view of the anisotropically conductive adhesive composition applied over conductive and insulating areas on a substrate.

FIG. 2 is an enlarged fragmentary cross-sectional view showing a layer of the adhesive composition over the conductive and insulating layers on one substrate, with the conductive areas on the coated substrate positioned in a conducting relationship with conductive areas on a second substrate.

FIG. 2A is an enlarged fragmentary cross-sectional view illustrating conductive units between two conductive areas, the units being comprised of flake shaped particles.

FIG. 2B is a view similar to FIG. 2A, the conductive units being comprised of spheroidal shaped particles.

FIG. 3 is a view similar to view 2 after the two surfaces have been adhered to each other.

FIG. 3A is a view similar to view 2A, after the two conductive areas have been adhered to each other.

FIG. 3B is a view similar to view 2B, after the two conductive areas have been adhered to each other.

FIG. 7 is a diagram of a graph plotting the total resistance through a length of lead-in conductive trace, a lap joint between two conductive traces joined by means of the anisotropically conductive adhesive composition disclosed herein, and a length of lead-out conductive trace versus the combined trace length between the two measuring points but not contained in the lap joint.

FIG. 8 is a diagrammatic view of the lap joint described in FIG. 7 illustrating how the measurements were taken.

DETAILED DESCRIPTION OF THE PREFERRED EMBODIMENT

Figure 4:
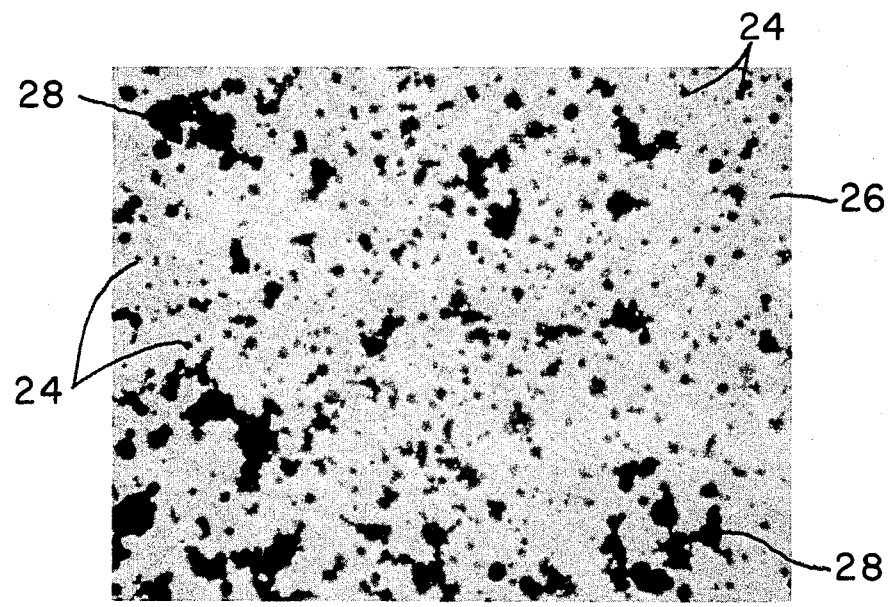
FIG. 4 is a micrograph of the adhesive composition having five percent by volume of palladium-coated nickel flakes. The surface is magnified 100× using an optical microscope.

FIGS. 1, 2 and 3 illustrate the intended use of the anisotropically conductive adhesive composition 10 which is comprised of a nonconductive adhesive binder 26 and a plurality of conductive particles, the particles being dispersed as noncontiguous conductive particle units 24.

The composition is used to bind conductive areas 14, 14' on a first substrate 12 with conductive areas 20, 20' on a second substrate 18. As is shown in FIG. 1, first substrate 12 has conductive areas 14, 14' and insulating areas 16, 16' on one surface. A layer 30 of the adhesive composition 10 is applied over the conductive 14, 14' and insulating areas 16, 16' on the first substrate 12.

As is further shown in FIG. 1, the conductive units 24 are dispersed randomly throughout the layer. The units 24 may be single particles or may be clusters 28 of particles. By controlling the volume percent of the conductive units 24, conductivity between adjacent conductive areas 14, 14' is precluded. The conductive units 24 are not contiguous and, therefore, cannot conduct electricity from one adjacent conductive area to another. There are, however, a sufficient number of conductive units 24 so that a plurality of the units 24 is deposited on the conductive areas 14 and 14'.

FIGS. 2 and 3 show a cross-sectional view of the substrates 12 and 18 having conductive areas 14, 14' and 20, 20' deposited respectively thereon. FIG. 2 shows the conductive areas 20 and 20' positioned in a conducting relationship with the conductive areas 14 and 14' and insulating area 22, 22' positioned in a conducting relationship with insulating areas 16, 16'. A layer of adhesive composition 30 has been deposited over the conductive 14, 14' and insulating areas 16, 16' of substrate 12. The adhesive is typically applied in a layer about 0.013 to 0.051 millimeters thick. FIG. 3 shows the substrates 12, 18 and their corresponding conductive 14, 14' and 20, 20' and insulating areas 16, 16' and 22, 22' adhered together. FIG. 3 also shows the conductive units 24 which electrically connect the conducting area 14 on substrate 12 with the corresponding conducting area 20 on substrate 18 and conductive area 14' to conductive area 20'.

FIGS. 2A, 2B, 3A and 3B are enlarged views of representative conductive units 24 in adhesive layer 30. FIGS. 2A and 3A illustrate units 24 formed of flake shaped particles 50. FIGS. 2B and 3B illustrate units 24 formed of spheroidal particles 52. FIGS. 2A and 2B show a layer 30 of adhesive composition 10 applied to conductive area 14 with corresponding conductive area 20 positioned in a conducting relationship to area 14. FIGS. 3A and 3B show conductive areas 14 and 20 after they have been adhered and electrically connected to each other. As areas 14 and 20 are brought against each other, and pressure is applied to adhere the layers, the individual particles within the units 24 move relative to each other thus expanding the conductive center of the unit 24. The complaint nature of the units 24 ensure electrical interconnection between conductive areas 14 and 20 since the surface area of the unit 24 in electric contact with areas 14 and 20 increases as the two areas are adhered to each other. Furthermore, since the units are compliant, the conductive units 24 need not be uniform in size to achieve electrical interconnection between two opposed conductive areas.

Figure 5:
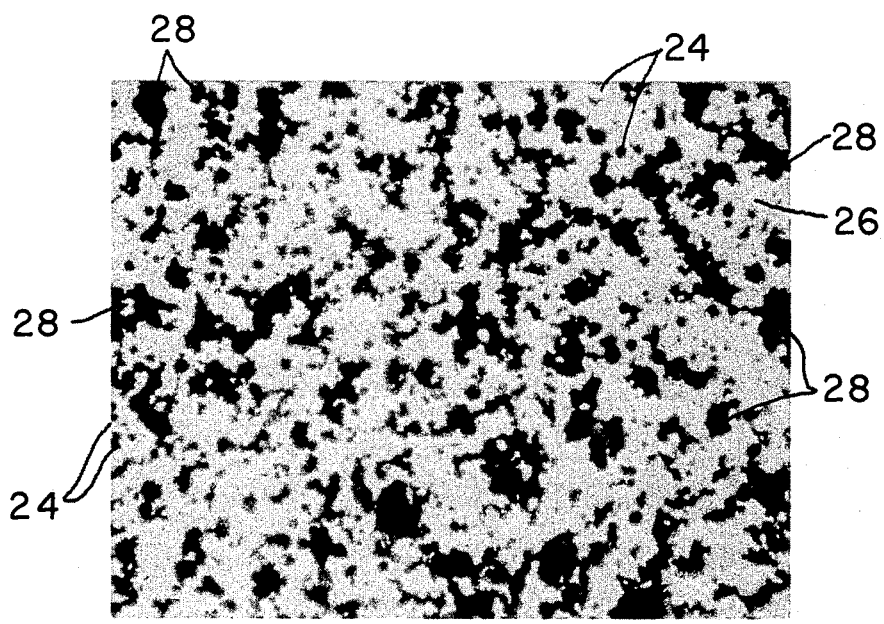
FIG. 5 is a view similar to view 4, the adhesive composition having ten percent by volume of palladium-coated nickel flakes.
Figure 6:
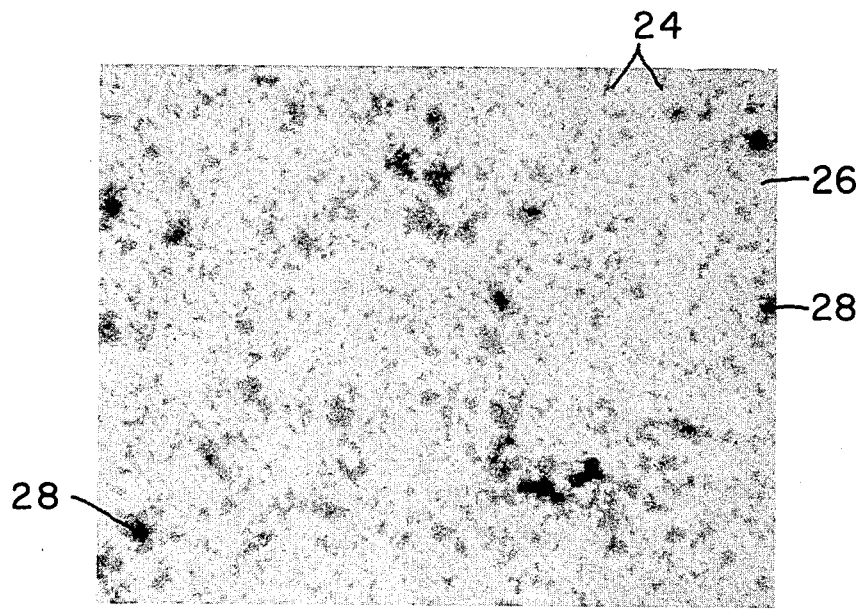
FIG. 6 is a view similar to view 4, the composition having five percent by volume of silver-coated nickel spheroids.

FIGS. 4, 5 and 6 are micrographs of three different formulations of the disclosed invention. All the micrographs are taken at 100× magnification. The micrograph represents an actual area of 1.143 millimeters by 0.889 millimeters. These micrographs illustrate that the conductive units 24 are sufficiently spaced apart in the binder 26 that there is no conductive path from one side of the area to another.

FIG. 4 shows the dispersion of a five percent by volume of palladium-coated nickel flakes in a pressure-sensitive adhesive binder. FIG. 5 shows the dispersion of a ten percent by volume of palladium-coated nickel flakes in a pressure-sensitive adhesive binder. FIG. 6 shows the dispersion of particles in a five percent by volume of silver-coated nickel spheroids having an average diameter of eight microns in a pressure-sensitive adhesive binder. The micrographs show that the number of particle clusters 28 increases as the percent by volume of conductive particles increases.

Various compositions of the anisotropically conductive adhesive were tested by applying a 2.54 centimeter wide layer of the adhesive to one end of a substrate having 1.27 millimeter wide silver ink traces on 2.54 millimeter centerlines deposited thereon. A second substrate having a similar deposit of traces was adhered to the first substrate to form a 2.54 centimeter wide lap joint.

Measurements of joint resistance were made to compare the effectiveness of various compositions of the anisotropically conductive adhesives and their ability to withstand environmental exposure. Referring now to FIG. 8, the resistance of a length of trace 34 starting on one substrate 36, including the lap joint, 38 and ending on the second substrate 40 was measured. Three such measurements, LA, LB, LC, at different distances of separation allowed relating resistance to the trace length outside the joint, $T_L$ ($T^L$ equals separation distance minus joint length). Linear least squares analysis of the data allowed the values of joint resistance and resistance per unit length of trace to be derived. These relationships are illustrated in FIG. 7.

Joint efficiency was found to be a useful parameter for comparing joint performance before and after environmental exposure since the resistance of the silver ink traces also changes during the test. Joint efficiency is defined as the measured joint conductance (reciprocal of resistance) divided by the theoretical joint conductance (reciprocal of theoretical joint resistance). The theoretical lap joint resistance depends only on the resistance per unit length of the silver ink traces and the joint length. It is independent of the number of perfectly conducting bridging elements found in a lap joint.

Insulation resistance was also measured between adjacent traces on the same substrate by applying a DC voltage of 100 volts. These measurements were found to exceed $10^9$ ohms. These measurements, therefore, were essentially equivalent to the resistivity of the insulating substrate when the loading was fifteen percent or less by volume of particles. Intertrace resistance of greater than $10^9$ ohms were observed fro trace separation as small as 0.127 millimeters for five percent by volume particle loaded adhesive. The resistance between adjacent traces dropped appreciably at volume percentages above fifteen percent. At twenty percent loading the resistance was approximately 100 ohms.

The anisotropically conductive adhesives of this invention are made by mixing electrically conductive particles with a nonconductive adhesive binder. The percent by volume of the particles is regulated so that the particles are dispersed throughout the mixture as noncontiguous conductive units, each unit comprised of one or a plurality of individual particles. The units are sufficiently spaced apart to preclude electrical conductivity between two or more adjacent conductive areas on the same substrate. There are, however, a sufficient number of particle units so that a plurality of units are applied to the conductive areas. Thus when conductive areas on two substrates are joined to each other, the conductive units provide an electrical contact between the conductive areas on the two substrates. The complaint nature of the units also ensures that a plurality of electrical interconnections will be achieved between corresponding conductive areas.

Anisotropically conductive adhesive compositions were made by varying the percentage loading from one to twenty percent by volume of the conductive particles in the nonconductive adhesive binder. The various compositions were applied to screened silver ink traces as previously described. Electrical conductivity through the lap joint occurred in all cases. The resistance between traces on the same substrate began to decrease at loadings greater than fifteen percent. The preferred loading range is from three to fifteen percent by volume. Particle loading within this range ensures that a plurality of conductive particle units are deposited on each conductive area. Loading within this range also ensures that resistance between traces on the same substrate is essentially equivalent to the resistance of the insulating substrate.

A variety of conductive particles may be used. These particles may be made from a single metal, a base metal coated with a noble metal such as silver, gold, palladium, platinum or rhenium, a non-metallic particle coated with a noble metal, or a conductive non-metallic substance.

The size of the particles is important. The particles should not be so large that one of them will bridge the gap between adjacent conductive areas on the same substrate.

The particles, however, cannot be so fine that they will not disperse into noncontiguous conductive units. Fine particles such as those used for conductive ink formulations tended to form a thin continous sheet layer and were not found suitable for anisotropically conductive adhesive compositions. Conductivity through the adhesive layer will not be achieved unless the conductive units approach the size of the depth of the adhesive layer. Depending upon the size of the particles used, the conductive unit may be a single particle or a plurality of clustered particles.

Adhesive compositions, in accordance with the invention, have been prepared using nickel flakes having average dimensions of 16.4 by 11.7 by 6 microns coated with a noble metal. Silver, gold and palladium-coated flakes have been used. Adhesive compositions have also been made using spheroidal nickel particles coated with silver. Nickel flakes and nickel spheroidal particles with or without a noble metal coating are available from Nova-Met Corporation, Wycoff, N.J.

Glass spheres covered with a noble metal can also be used. These spheres are available from Potters Industries, Inc., Hasbrouck Heights, N.J.

It is to be understood that the conductive particles described above are merely examples of the various types of particles that may be used to make effective anisotropically conductive adhesives.

It is believed, however, that palladium-coated particles will provide improved electro-migration protection when anisotropically conductive adhesive compositions are used under conditions where moisture is a problem.

A variety of adhesive binders may be used such as pressure-sensitive adhesives, hot melt adhesives, and polymerizable adhesives. There are numerous adhesive binders available on the market.

Conventional methods such as pressure, heat and pressure, ultra violet light are used to achieve adhesion between the two surfaces. The method chosen depends primarily on the nature of the binder used to formulate the adhesive composition.

The anisotropically conductive adhesive composition is formulated by adding a volume percentage of conductive particles to the binder. For any given volume percentage, the size of the particles will determine the number of particles in that volume. The number of particles varies inversely with the size of the particles used. Typically the particles used are smaller than the thickness of the adhesive layer.

The particles have a tendency to form clusters during the mixing of the composition. These clusters are of sufficient size to permit conductivity through the layer of adhesive composition. Larger particles, such as 25 micron spheres, are of a sufficient size to provide single particle conduction through 0.025 millimeter thick layer of adhesive composition.

The adhesive composition may be applied to a substrate in a variety of ways depending upon the nature of the binder and the size of the particles used. The adhesive composition may be directly applied to a substrate by silk-screening a solvated version of the composition and subsequently evaporating the solvent.

The adhesive composition can also be applied to a release paper by knife-spreading, silk-screening, or extrustion techniques, and then covered with a second sheet of release paper. This is used as a transfer type of adhesive film. The release paper is peeled from one side of the adhesive film, the film is applied to the desired area, and the second release paper is removed prior to attaching the second substrate. For some applications the adhesive compositions may be extruded directly onto the desired substrate.

The anisotropically conductive adhesive composition as disclosed herein can be used to interconnect conductive areas such as silk-screened ink or electrodeposited traces on flexible substrates or circuit boards and can be used to mount component parts directly to circuit traces on such substrates.

The following examples illustrate the invention. They are not to be construed as limitations on the instant invention except as indicated in the appended claims. All compositions are expressed as percent by volume except where specifically indicated otherwise.

EXAMPLE 1

2.59 grams of palladium-coated nickel flakes (19 milligrams palladium per gram of nickel), 16.4 by 11.7 by 6 microns average size, having 0.055 square meters per gram specific surface area were mixed with 25 grams of Morton Adcote 72A106 (36.4 percent by weight solids) rubber based pressure-sensitive adhesive with 0.5 percent by weight Inmont RW0158 flow modifier. Mixing was accomplished with a propeller-type stirrer at moderate rotations per minute for approximately 15 minutes. Immediately after stirring, the mixture was spread on silicone-coated release paper with a Gardner Knife and subsequently heated at 125° Celsius for thirty minutes to drive off unwanted solvents. This resulted in an anisotropically conducting pressure-sensitive adhesive film approximately 0.02 millimeters thick that contained three percent by volume filler. Placing another sheet of silicone-coated release paper on top of the adhesive film allowed the adhesive film to be cut to desired shapes. Square preforms 2.54 centimeters on a side were cut from the release paper covered adhesive film sandwich.

Lap joints were prepared from 2.54 centimeters wide by 7.62 centimeters long by 0.127 millimeters thick polyester film strips with five screen-printed printed silver ink traces 1.27 millimeters wide on 2.54 millimeters centers printed on them. One joint strip was placed on an elastomeric bonding pad (shore hardness 85) with the traces facing up. The top release paper sheet was peeled from the preform sandwich. The preform was aligned over the designated joint area with the adhesive side facing the conductors. Light finger pressure was used to tack the preform sandwich in place. Additional pressure was applied with a 2.04 kilogram, 8.25 centimeter diameter steel disk roller compression bonder. The roller compression bonder was rolled back and forth over the joint area using two back and forth cycles parallel to the conductive traces and two back and forth cycles perpendicular to the conductive traces.

The back release paper was then peeled off. A second polyester film strip with conductive ink traces similar to the first strip was positioned over the joint area to form a 2.54 centimeter lap joint with mating conductive traces aligned. Using light finger pressure, the second strip was tacked into place. Final bonding pressure was applied with a 7.26 kilogram, 8.25 centimeter diameter steel disk roller compression bonder. The roller compression bonder was rolled back and forth over the joint area using two back and forth cycles parallel to the conductive traces and two back and forth cycles perpendicular to the conductive traces. Electrical continuity could be demonstrated immediately after joint formation, but steady state bond properties typically took 72 hours to become fully established. 180 degree peel test and lap shear strength test results are shown in Table 1. Joint resistance properties are shown in Table 2.

EXAMPLE 2

Using the same materials and methods described in Example 1, an anisotropically conductive pressure-sensitive adhesive film with five percent by volume filler was produced by starting with 4.40 grams of palladium-coated nickel flakes and 25 grams of modified Morton binder. Lap joint specimens were made with this adhesive film in a manner similar to that described in Example 1. The results of 180 degree peel test and lap shear tests are shown in Table 1. Joint resistance properties are shown in Table 2.

EXAMPLE 3

Using the methods described in Example 1, an anisotropically conductive pressure-sensitive adhesive film with five percent by volume filler was produced by starting with 4.79 grams of coated nickel flakes similar to those described in Example 1, but coated with gold (169.9 milligrams gold per gram of nickel) instead of palladium and 25 grams of modified Morton binder also described in Example 1. Lap joint specimens were made with this adhesive film in a manner similar to that described in Example 1. Joint resistance properties are shown in Table 2.

EXAMPLE 4

Using the methods described in Example 1, an anisotropically conductive pressure-sensitive adhesive film with five percent by volume filler was produced by starting with 4.50 grams of silver-coated nickel spheroids (8 micron diameter, 15 percent by weight silver) and 25 grams of the modified Morton binder described in Example 1. Lap joint specimens were made with this adhesive film in a manner similar to that described in Example 1. Joint resistance properties are shown in Table 2.

EXAMPLE 5

15.82 grams of silver-coated nickel spheroids (8 micron diameter, 15 percent by weight silver) were mixed with 100 grams of a solvated polyester resin blend (33 percent by weight solids). This resulted in a hot melt anisotropically conductive adhesive composition having five percent by volume of silver-coated spheroids. Mixing was accomplished with a propeller-type stirrer at moderate rotations per minute for approximately fifteen minutes. Immediately after stirring, the mixture was screen-printed using a 105 mesh stainless steel screen on an area of 0.127 millimeters thick polyester film which contained five 1.27 millimeter wide screen-printed conductive silver ink traces on 2.54 millimeter centers. Unwanted solvents were driven off by heating at 125° Celsius for thirty minutes. The resulting anisotropically conductive adhesive film exhibited very little tack and contained five percent by volume conductive filler.

Lap joints were made by utilizing 2.54 centimeter wide strips of polyester film with the five conductive traces centered on the film. One strip without the anisotropically conductive adhesive film was placed trace-side-to-trace-side on top of a strip with the anisotropically conductive adhesive film. The conductive traces on one strip were aligned with the conductive traces on the other strip and the joint area was subjected to a pressure of 2.46 kilograms per square centimeter gauge and a temperature of 120° Celsius for fifteen seconds. Lap joints 2.54 centimeters long were made for the joint resistance and lap shear strength specimens. Lap joints 5.08 centimeters long were made for the peel test specimens. The lap joint strength properties are shown in Table 1. The lap joint resistance properties are shown in Table 2.

TABLE 1

LAP JOINT STRENGTH PROPERTIES

| | | −40C | | | 20C | | | 85C | | |
|---|---|---|---|---|---|---|---|---|---|---|
| | | 180° Peel[a] | | LSS[b] | 180° Peel[a] | | LSS[b] | 180° Peel[a] | | LSS[b] |
| Filler Type | Percent Loading by Volume | FTI[c] (g/cm) | SS[d] (g/cm) | (Kg/cm$^2$) | FTI[c] (g/cm) | SS[d] (g/cm) | (Kg/cm$^2$) | FTI[c] (g/cm) | SS[d] (g/cm) | (Kg/cm$^2$) |
| Palladium-coated Nickel Flakes[e] | 3 | 191 | 125 | 7.38 | 339 | 309 | 5.69 | 125 | 95 | 1.90 |
| Palladium-coated Nickel Flakes[f] | 5 | 246 | 130 | 7.24 | 280 | 250 | 5.55 | 102 | 77 | 1.55 |
| Silver-coated Nickel Spheroids[g] | 5 | 143 | 143 | 6.19 | 1238 | 1155 | 6.40 | 9 | 9 | 0.773 |

NOTES:
[a]180 degree peel test on 5.08 centimeter lap joint samples. Instron head speed 30.48 centimeters per minute. Similar to ASTM D-903.
[b]Lap shear strength test on 2.54 centimeter lap joint samples. Instron head speed 5.08 centimeters per minute. Similar to ASTM D-1002.
[c]Force to initiate peel.
[d]Steady state peel force.
[e]Example 1.
[f]Example 2.
[g]Example 5.

TABLE 2

LAP JOINT RESISTANCE PROPERTIES

| Filler Type | Percent Loading by Volume | Joint Efficiency[a] (Percent) | Joint Resistance[b] (Ohm) | Trace Resistance[c] (Milliohm/cm) |
|---|---|---|---|---|
| Before Environmental Exposure | | | | |
| Palladium-coated Nickel Flakes[d] | 3 | 66 (5)[i] | .79 (.11)[i] | 406 (39) |
| Palladium-coated Nickel Flakes[e] | 5 | 69 (11) | .63 (.10) | 339 (35) |
| Gold-coated Nickel Flakes[f] | 5 | 78 (1) | .57 (.04) | 354 (28) |
| Silver-coated Nickel Spheroids[g] | 5 | 84 (8) | .55 (.06) | 358 (12) |
| Silver-coated Nickel Spheroids[h] | 5 | 88 (14)[k] | .40 (.14)[k] | 276 (110)[k] |
| After Cycled Temperature Humidity Exposure[m] | | | | |
| Palladium-coated Nickel Flakes[e] | 5 | 83 (3)[i] | .40 (.03)[i] | 264 (16)[i] |
| Gold-coated Nickel Flakes[f] | 5 | 93 (4) | .40 (.03) | 291 (28) |
| Silver-coated Nickel Spheroids[g] | 5 | 85 (6) | .43 (.06) | 283 (16) |
| Silver-coated Nickel Spheroids[h] | 5 | 81 (11)[k] | .36 (.14)[k] | 240 (94)[k] |

NOTES:
[a]Joint Efficiency = (Joint Conductance)/(Theoretical Joint Conductance) = (Trace Resistance/cm) × (1000) × (Joint Length) × (0.5)/(Joint Resistance)
[b]Joint Resistance = Resistance through the 2.54 centimeter joint length region.
[c]Trace Resistance = Silver Ink Trace Resistance
[d]Example 1.
[e]Example 2.
[f]Example 3.
[g]Example 4.
[h]Example 5.
[i]95 percent Confidence limits for the average of five samples each consisting of the average of five individual trace measurements.
[k]95 percent Confidence limits for the average of three samples each consisting of the average of five individual trace measurements.
[m]Cycled Temperature Humidity - Test similar to (Mil. Std. 810 C., Method 507.1, Procedure 1) - ten cycles at 85 percent RH: 25 C. to 85 C. in two hours, 85 C. for six hours, 85 C. to 25 C. in sixteen hours.

It is thought that the anisotropically conductive adhesive composition of the present invention and many of its attendant advantages will be understood from the foregoing description and examples. It will be apparent that various changes may be made in the percentage composition of the components and the type of conductive particles used, without departing from the spirit or scope of the invention or sacrificing all its material advantages. The anisotropically conductive adhesive composition may be used to interconnect conductive areas on a variety of substrates. The form herein described is merely a preferred or exemplary embodiment thereof.

We claim:

1. An anisotropically conductive adhesive composition for use in electrically connecting at least one conductive area on one substrate with at least one conductive area on a second substrate, each substrate having conductive and insulating areas on at least one surface thereof, the adhesive composition being characterized in that:

the composition is comprised of a nonhomogenous mixture of conductive particles in a nonconductive adhesive binder;

the conductive particles, not requiring a specific shape, are dispersed randomly throughout the mixture in noncontiguous, self-evidently discrete, and nonaligned conductive units, each unit being comprised of a plurality of individual particles, the units being sufficiently spaced apart to preclude electrical conductivity between adjacent conductive areas on the same substrate, whereby upon applying a layer of the adhesive composition over the conductive and insulating areas on the first substrate and positioning in a conducting relationship and adhering said at least one conductive area on the second substrate with said at least one conductive area on the first substrate, the units establish electrical connection between the adhered conductive areas on the two substrates.

2. The anisotropically conductive adhesive composition as recited in claim 1 further characterized in that the nonconductive adhesive binder is selected from the group consisting of pressure sensitive adhesives, hot melt adhesives and polymerizable adhesives.

3. The anisotropically conductive adhesive composition as recited in claim 1 further characterized in that the conductive particles are selected from the group consisting of metals, nonmetallic bases coated with a metal and conductive nonmetals.

4. The anisotropically conductive adhesive composition as recited in claim 2 further characterized in that the conductive particles are selected from the group consisting of metals, nonmetallic bases coated with a metal and conductive nonmetals.

5. The anisotropically conductive adhesive composition as recited in claim 1 further characterized in that the individual conductive particles are smaller in size than the thickness of the applied layer of adhesive.

6. An anisotropically conductive adhesive composition for use in electrically connecting one or more conductive areas on one substrate with one or more conductive areas on a second substrate, each substrate having conductive and insulating areas on at least one surface thereof, the adhesive composition comprising:

a thin film electrically anisotropically conductive mixture of electrically conductive particles in a nonconductive adhesive binder, at least a portion of the particles being agglomerated into non-aligned, randomly dispersed, self-evidently discrete, noncontiguous clusters, the conductive particles being present in a concentration of less than 20 percent by volume exclusive of volatile solvents, whereby upon applying a layer of the adhesive composition over the conductive and insulating areas on the first substrate and engaging and adhering the conductive areas on the second substrate with the conductive areas on the first substrate, the units establish electrical connection between the adhered conductive areas on the two substrates.

7. The anisotropically conductive adhesive composition as recited in claim 6 wherein said shape of the individual clusters is independent of the direction perpendicular to the conductive areas on said substrates.

8. The anisotropically conductive adhesive composition as recited in claim 6 wherein the nonconductive adhesive binder is selected from the group consisting of pressure sensitive adhesives, hot melt adhesives and polymerizable adhesives.

9. The anisotropically conductive adhesive composition as recited in claim 6 wherein the conductive particles are selected from the group of materials consisting of metals, nonmetallic bases coated with a metal and conductive nonmetals.

10. The anisotropically conductive adhesive composition as recited in claim 8 wherein the conductive particles are selected from the group of materials consisting of metals, nonmetallic bases coated with a metal and conductive nonmetals.

11. The anisotropically conductive adhesive as recited in claim 9 wherein said conductive particles are coated with a noble metal, said noble metal being selected from the group consisting of gold, silver, palladium, platinum or rhenium.

12. The anisotropically conductive adhesive as recited in claim 10 wherein said conductive particles are coated with a noble metal, said noble metal being selected from the group consisting of gold, silver, palladium, platinum or rhenium.

13. A method for electrically connecting one or more conductive areas on one substrate with one or more conductive areas on a second substrate, each substrate having conductive and insulating areas on at least one surface thereof, the method comprising the steps of:

applying a layer of an anisotropically conductive composition over the conductive and insulating areas on the first substrate, the anisotropically conductive adhesive composition being comprised of a mixture of electrically conductive particles in a nonconductive adhesive binder, at least a portion of the particles being agglomerated into non-aligned, randomly dispersed, self-evidently discrete noncontiguous clusters, the conductive particles being present in a concentration of less than 20 percent by volume exclusive of volatile solvents, the agglomerated clusters and remaining particles being noncontiguous conductive units, said units being sufficiently spaced apart to preclude electrical conductivity between conductive areas on the same substrate;

aligning the conductive areas on the first substrate with the conductive areas on the second substrate;

adhering the conductive areas on the first substrate with the conductive areas on the second substrate, whereby the noncontiguous conductive units establish electrical connection between the adhered conductive areas on the two substrates.

14. A product comprised of two or more substrates, each substrate having one or more conductive and insulating areas on at least one surface thereof, the conductive area on a first substrate being electrically connected to a corresponding conductive area on a second substrate, the electrical connection being accomplished by the method of comprising the steps of:

applying a layer of an anisotropically conductive composition over the conductive insulating areas on the first substrate, the anisotropically conductive adhesive composition being comprised of a mixture of electrically conductive particles in a nonconductive adhesive binder, at least a portion of the particles being agglomerated into non-aligned, randomly dispersed, self-evidently discrete, noncontiguous clusters, the conductive particles being present in a concentration of less than 20 percent by volume exclusive of volatile solvents, said agglomerated clusters and remaining particles being noncontiguous conductive units, said units being sufficiently spaced apart to preclude electrical conductivity between adjacent conductive areas on the same substrate;

aligning the one or more conductive areas on the first substrate with the one or more conductive areas on the second substrate;

adhering the one or more conductive areas on the first substrate with the one or more conductive areas on the second substrate, whereby the noncontiguous conductive units establish electrical connection between the adhered conductive areas on the two substrates.

15. A method for electrically connecting at least one conductive area on one substrate with at least one conductive area on a second substrate, each substrate having conductive and insulating areas on at least one surface thereof, the method comprising the steps of:

applying a layer of an anisotropically conductive composition over the conductive and insulating areas on the first substrate, the anisotropically conductive adhesive composition being comprised of a nonhomogenous mixture of conductive particles in a nonconductive adhesive binder, the conductive particles not requiring a specific shape being dispersed randomly throughout the mixture in noncontiguous, self-evidently discrete, and nonaligned conductive units, each unit being comprised of a plurality of individual particles, the units being sufficiently spaced apart to preclude electrical conductivity between adjacent conductive areas on the same substrate;

positioning in a conducting relationship said at least one conductive area on the first substrate with said at least one conductive area on the second substrate;

adhering said at least one conductive area on the first substrate with said at least one conductive area on the second substrate, whereby the noncontiguous conductive units establish electrical connection between the adhered conductive areas on the two substrates.

16. The method for electrically connecting at least one conductive area on one substrate with at least one conductive area on a second substrate as recited in claim 15 wherein said conductive units are compliant.

17. The method for electrically connecting at least one conductive area on one substrate with at least one conductive area on a second substrate as recited in claim 15 wherein said nonconductive adhesive binder is selected from the group consisting of pressure sensitive adhesives, hot melt adhesives and polymerizable adhesives.

18. The method for electrically connecting one or more conductive areas on one substrate with one or more conductive areas on a second substrate as recited in claim 15 wherein said conductive particles are selected from the group consisting of metals, nonmetallic bases coated with a metal and conductive nonmetals.

19. A product comprised of at least two substrates, each substrate having at least one conductive area and at least one insulating area on at least one surface thereof, a conductive area on a first substrate being electrically connected to a corresponding conductive area on a second substrate, the electrical connection being accomplished by the method comprising the steps of:

applying a layer of an anisotropically conductive composition over the conductive and insulating areas on the first substrate, the anisotropically conductive adhesive composition being comprised of a nonhomogenous mixture of conductive particles in a nonconductive adhesive binder, the conductive particles not requiring a specific shape and being dispersed randomly throughout the mixture in noncontiguous, self-evidently discrete, and nonalignes conductive units, each unit being comprised of a plurality of particles, the units being sufficiently spaced apart to preclude electrical conductivity between adjacent conductive areas on the same substrate; adhering said at least one conductive area on the first substrate, whereby with said at least one conductive area on the second substrate, the noncontiguous conductive units establish electrical connection between the adhered conductive areas on the two substrates.

20. The method for electrically connecting at least one conductive area on one substrate with at least one conductive area on a second substrate as recited in claim 19 wherein said conductive units are compliant.

21. The method for electrically connecting at least one conductive area on one substrate with at least one conductive area on a second substrate as recited in claim 19 wherein said nonconductive adhesive binder is selected from the group consisting of pressure sensitive adhesives, hot melt adhesives and polymerizable adhesives.

22. The method for electrically connecting one or more conductive areas on one substrate with one or more conductive areas on a second substrate as recited in claim 19 wherein said conductive particles are selected from the group consisting of metals, nonmetallic bases coated with a metal and conductive nonmetals.

* * * * *